US006948341B2

United States Patent
Beach et al.

(10) Patent No.: US 6,948,341 B2
(45) Date of Patent: Sep. 27, 2005

(54) CYLINDRICAL MICROLENS WITH AN INTERNALLY REFLECTING SURFACE AND A METHOD OF FABRICATION

(75) Inventors: Raymond J. Beach, Livermore, CA (US); Barry L. Freitas, Livermore, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 10/741,047

(22) Filed: Dec. 18, 2003

(65) Prior Publication Data

US 2004/0129025 A1 Jul. 8, 2004

Related U.S. Application Data

(62) Division of application No. 10/121,468, filed on Apr. 10, 2002, now Pat. No. 6,710,926.

(51) Int. Cl.[7] .............................................. C03B 37/02
(52) U.S. Cl. .............................. 65/403; 65/407; 65/61; 264/1.24; 264/1.32; 264/1.6; 264/1.9
(58) Field of Search .......................... 65/61, 403, 407; 264/1.24, 1.32, 1.6, 1.9

(56) References Cited

U.S. PATENT DOCUMENTS

| 3,879,182 A | * | 4/1975 | Strack ............................ 65/37 |
| 3,989,495 A | * | 11/1976 | Siegmund ...................... 65/31 |
| 5,080,706 A | | 1/1992 | Snyder et al. |
| 5,081,639 A | | 1/1992 | Snyder et al. |
| 5,105,429 A | | 4/1992 | Mundinger et al. |
| 5,181,224 A | * | 1/1993 | Snyder ....................... 372/101 |
| 5,303,322 A | | 4/1994 | Winston et al. |
| 5,548,605 A | | 8/1996 | Benett et al. |
| 5,638,214 A | * | 6/1997 | Doric ......................... 359/654 |
| 5,828,683 A | | 10/1998 | Freitas |
| 5,923,481 A | | 7/1999 | Skidmore et al. |
| 6,137,631 A | | 10/2000 | Moulin |
| 6,256,447 B1 | | 7/2001 | Laine |
| 6,772,608 B1 | * | 8/2004 | Drost et al. ................. 65/30.1 |

OTHER PUBLICATIONS

Beach, R. J., et al., "Applications of Microlens–Conditioned Laser Diode Arrays," SPIE vol. 2383,1995, Proceeding Reprint Micro–Optics/Micromechanics and Laser Scanning and Shaping, Feb. 7–9, 1995, San Jose, CA, pp. 283–297, (16 pages w/cover sheet).

Snyder, J. J., et al., "Fast diffraction–limited cylindrical microlenses," Applied Optics, vol. 30, No. 19, Jul. 1, 1991, pp. 2743–2747, (5 pages).

* cited by examiner

*Primary Examiner*—Sean Vincent
(74) *Attorney, Agent, or Firm*—Michael C. Staggs; Alan H. Thompson (57) ABSTRACT

A fast (high numerical aperture) cylindrical microlens, which includes an internally reflective surface, that functions to deviate the direction of the light that enters the lens from its original propagation direction is employed in optically conditioning laser diodes, laser diode arrays and laser diode bars.

20 Claims, 5 Drawing Sheets

CYLINDRICAL MICROLENS WITH AN INTERNALLY REFLECTING SURFACE AND A METHOD OF FABRICATION

RELATED APPLICATION

This application is a division of U.S. application Ser. No. 10/121,468, filed Apr. 10, 2002, entitled "A Cylindrical Microlens With an Internally Reflecting Surface and a Method of Fabrication now U.S. Pat. No. 6,710,926."

The United States Government has rights in this invention pursuant to Contract No. W-7405-ENG-48 between the United States Department of Energy and the University of California for the operation of Lawrence Livermore National Laboratory.

BACKGROUND OF THE INVENTION

1. Field of the Invention

The present invention relates to microlenses. More specifically, the present invention relates to cylindrical microlenses for use with laser diodes, laser diode bars, and integrated optics.

2. Description of Related Art

A lens is an optical element that can focus or de-focus electromagnetic radiation (i.e., light). The most common types of lenses are spherical; for example, a circular convex lens focuses light to a point. Such lenses are useful in many applications such as imaging, photolithography, and metrology. The common spherical lens has a shape that is symmetric about an optic axis.

Another lens that is important is a cylindrical lens. A cylindrical converging lens focuses light along a line, typically termed the "line focus." The typical cylindrical lens is shaped symmetrically around a principal axis, which is orthogonal to the optic axis. For example, a cylindrical lens may have the shape of a cylinder, with circular dimensions around a central axis. Light is made incident on a first curved surface of the cylinder, and exits from the other second curved side of the cylinder.

For many applications, a circular cross-section is undesirable, and therefore, the curves of cylindrical lenses may require specific shapes that differ from the circular curve of the previous example. The required shape may be flat or it could be some other non-circular curve such as an ellipse of hyperbola. In other words, cylindrical lenses may be formed with a variety of curved surfaces. The exact shape is highly dependent upon the application. For example, laser diodes and similar types of architecture have different divergence angles along orthogonal axis due to their rectangular shaped output apertures. Because of this characteristic, a cylindrical lens can be shaped to collimate the fast axis (i.e., the fast divergent axis) of a laser diode by matching the divergence of the slow axis (i.e., the slow divergence axis). One method for creating cylindrical lenses with selected shapes is described and claimed in U.S. Pat. No. 5,080,706 issued Jan. 14, 1992 and U.S. Pat. No. 5,081,639 issued Jan. 14, 1992, each issued to Snyder et al., and assigned to the assignee of the instant application. In addition, the method for creating cylindrical lenses with selected shapes is described in "Fast diffraction-limited cylindrical microlenses," by Snyder et al., Applied Optics Vol. 30, pp. 2743–2747, 1991.

Cylindrical microlenses shaped for a specific application are utilized for integrated optics and optically conditioning radiation of laser diode bars. In recent years, the ability to package and to condition the radiance of laser diodes using shaped-fiber cylindrical-microlens technology has dramatically increased the number of applications that can be practically engaged by diode laser arrays. Government research and development in this area has created improvements in this technology in an effort to supply large radiance conditioned laser diode array sources for its own internal programs as well as for industrial applications.

Original efforts on the development of modular integrated laser diode packaging technology is described in "Applications of Micro-lens-Conditioned Laser Diode arrays," by R. J. Beach et al., SPIE Vol. 2383, p 283, 1995 and in U.S. Pat. No. 5,105,429 issued Aug. 14, 1992 to Mundinger et al. Recently, advances beyond the original rack and stack technologies in which typically only a single laser diode bar was attached to a single high performance heat sink have enabled monolithic laser diode packages in which multiple diode bars are attached to a single high performance heat sink. This technology advance has led to larger laser diode arrays and larger diode-pumped laser systems. One type of monolithic package is manufactured from silicon substrates and uses microchannels fabricated directly into the silicon to aggressively remove the waste heat that is generated by diode bars that are attached to the silicon. This type of package, which utilizes Silicon Monolithic Microchannels (i.e., SiMM) was originally intended for high average power applications. There is also a low duty factor package, which is closely related to the SiMM package, but does not incorporate microchannels in the silicon. This package is known as V-BASIS, and except for the lack of microchannels, is very similar to the SiMM package in its structure. Basically, the SiMM package retains many of the same basic features of the original rack and stack package, but engages a higher level of integration with multiple diode bars attached to a single based chip carrier. Such approaches are described and claimed in U.S. Pat. No. 5,548,605 issued Aug. 20, 1996 to Benett et al., U.S. Pat. No. 5,828,683 issued Oct. 27, 1998 to Freitas, and U.S. Pat. No. 5,923,481 issued Jul. 13, 1999 to Skidmore et al., and assigned to the assignee of the instant application.

Both the SiMM package and the V-BASIS package have been remarkably successful in building very large laser diode arrays. However, a major problem remains with conventional optical conditioning of the radiation emitted by laser diode bars attached to these packages if conventional microlenses are used. The problem is associated with the V-grooves in which the laser diode bars are attached. Due to the orientation of the V-grooves, the radiation emitted by laser diodes that are attached to them is directed away from the normal to the face of the package. In some instances, this off-normal directed emission is an aspect of the package that can be overcome by suitably orienting the package to compensate for the off-normal emission direction. In other instances, it is required that the conditioned light be emitted from the package in a direction along the normal to the face of the package. The V-grooves result from the etching process used in their fabrication. In addition to the formation of V-grooves for positioning and mounting laser diode bars, the same V-groove technology is used to fabricate microchannels into the silicon substrate. Anistropic etching of silicon takes advantage of the fact that some chemicals, e.g., potassium hydroxide, etch crystal planes of different orientations at different rates. In <110> oriented wafers, (the surface of the wafer is a <110> plane), etch rate differences can be exploited to etch channels that are perpendicular to the surface of the wafer. This is accomplished by creating a mask on the surface of the wafer that is aligned with the <111> planes on the wafer. When etched, these slow-etching, perpendicular <111> planes then become the walls of the channels. With the appropriate angular orientation of an etch mask on a <110> oriented silicon wafer, the result of the above etching method is to produce V-grooves wherein laser emitting diodes or laser diode bars are attached to the slanted surfaces, i.e., the <111> plane, and as such are oriented in a very specific way relative to the <110> normal direction.

Accordingly, in addition to performing the required lens collimation task, the present invention provides a cylindrical microlens for deviating the off-normal optical rays to enable emission which is normal to the plane of the array. In addition, the present invention can be incorporated into high average power, high density, two-dimensional arrays to solve a need in industry and research environments for optical conditioning of these devices.

SUMMARY OF THE INVENTION

Accordingly, the present invention provides a lens, which includes an internally reflecting surface, which functions to deviate the direction of light that enters the lens from its original propagation direction while providing a collimated output.

Another aspect of the present invention is to provide a laser diode apparatus whereby a fast (high numerical aperture) cylindrical microlens conditions the output from a laser diode and deviates emission from the laser diode from its original direction in such a way that the laser diode emission is directed normal to a diode array plane.

A further aspect of the present invention is to provide a two-dimensional array of laser diode bars wherein an output emission from each laser diode bar is conditioned by a fast cylindrical microlens and deviated from its original direction in such a way that the laser diode bar output emission is directed normal to a diode bar array plane.

The present invention additionally provides for a method of conditioning emission from a laser diode so that the output emission from the laser diode is deviated from its original direction and directed normal to a diode array plane.

Cylindrical microlenses have found wide application as optical devices for collimating the fast-axis radiation from laser diode emitters (i.e., the direction perpendicular to the p-n junction of the diode). When microlens conditioning is applied to large two-dimensional semiconductor laser diode arrays consisting of multiple diode bars, the effective radiance (W/cm$^2$-str) of the array is increased by the ratio of the fast-axis divergence of the diode radiation before the cylindrical microlens lens to the fast-axis divergence of the radiation after the cylindrical microlens. This radiance enhancement, which can be up to one hundred times, has many practical applications and has tremendously enhanced the utility of laser diode arrays.

The present invention includes a totally reflecting internal surface in a cylindrical microlens, and is useful in applications where radiance enhancement is advantageous. Additionally, by including a totally reflective internal surface in the lens structure itself, the present invention enables the direction of the emitted light from the microlens to be deviated from its original optic axis in a precisely controlled way. Particularly for laser diode array packaging technologies in which the diode radiation is emitted in some direction not normal to the plane of the diode package, this feature of deviating the direction of the light while also collimating it with a single structure broadens the application space of laser diode arrays.

Finally, the lens of the present invention can be used to optically condition laser diode arrays to provide directional and narrow light sources such as are required in various spectroscopic devices used to identify chemical and biological substances.

BRIEF DESCRIPTION OF THE DRAWINGS

The accompanying drawings, which are incorporated into and form a part of the disclosure, illustrate an embodiment of the invention and, together with the description, serve to explain the principles of the invention.

DETAILED DESCRIPTION OF THE INVENTION

General Description

The prior art cylindrical-technology (i.e., shaped fiber lenses) to condition large radiance conditioned laser diode array sources has centered on the development of a modular integrated laser diode package. One of the convenient features of large two-dimensional diode arrays constructed from this technology is the normal emission direction relative to the array face, (See R. J. Beach et al., "Applications of Micro-lens-conditioned Laser-Diode Arrays," SPIE, Vol. 2383, p. 283 (1995). However, subsequent technology, (i.e., Silicon Monolithic Microchannels (SiMM) and V-BASIS), which has kept many features of the modular integrated laser diode packages, does not have the normal emission feature because the diodes in these packages are attached to slanted surfaces defined by the V-grooves that are due to anistropic etching of silicon wafers.

Figure 1:
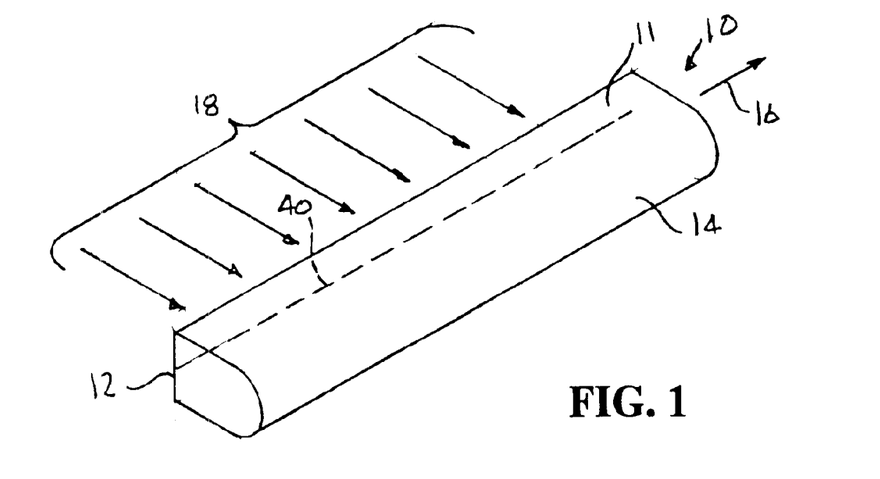
FIG. 1 illustrates a cylindrical lens.

FIG. 1 illustrates a conventional cylindrical lens 10, comprising a body 11, having a first surface 12 and a second surface 14. As illustrated in FIG. 1, light rays 18 enter the body 11 of the cylindrical lens 10 through the first surface 12, and exit the lens 10 through the second surface 14. In other configurations, the direction of light propagation may be reversed.

The light passing through cylindrical lens 10 is greatly affected by the shape of the first surface 12 and the second surface 14. Depending upon the shapes of the surface 12, 14 and also depending upon the propagation direction of the light (i.e., curved surface 14 could be positioned to first receive emission from a laser diode and flat surface 12 could be the exit surface), the exiting light may be focused, de-focused, distorted, or otherwise changed in characteristics. In a preferred embodiment, a focal line 40, which is at the focal position of curved surface 14, will be positioned proximate to the first surface 12 and will exit the curved surface 14 substantially collimated. The method for fabricating cylindrical lenses 10 (FIG. 1) is disclosed in U.S. Pat. No. 5,080,706, titled "Method for fabrication of cylindrical microlenses of selected shape," by J. J. Snyder and T. M. Baer, which is fully incorporated herein by reference in its entirety.

Figure 2:
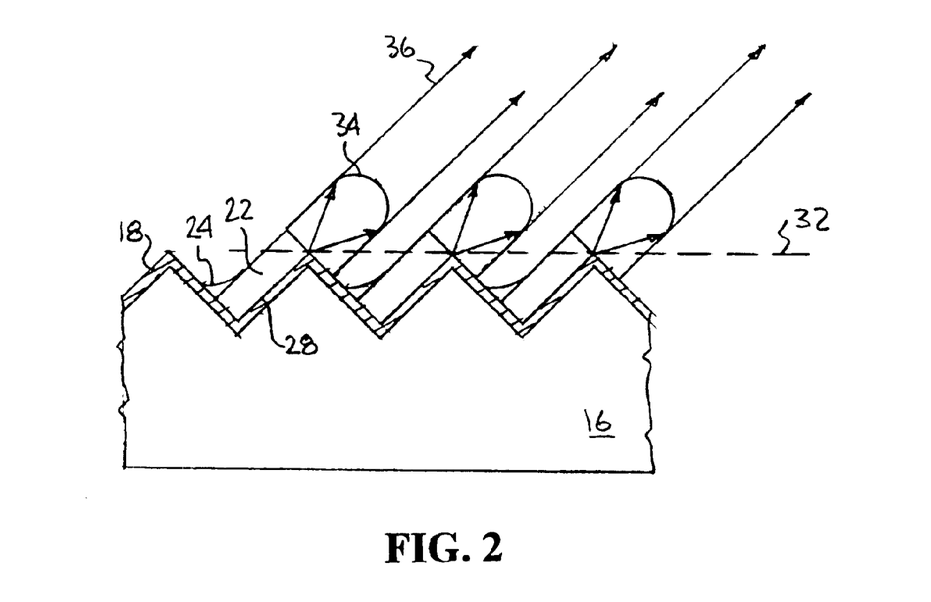
FIG. 2 shows the basic concept of non-normal emission from a multitude of laser diode bars attached to plane surfaces in silicon V-grooves, where the plane surfaces are defined by <111> planes.

FIG. 2 illustrates a problem of non-normal emission by SiMM and V-BASIS technology, comprising an angular V-groove in a silicon base 16 and a metalization layer 18. Laser diode bars 22 are located against the metalization layer 18 and are soldered into place with solder 24 at about a 54.7 degree off-axis angle defined by V-groove mounting on a <111> plane 28 with respect to a silicon <110> substrate surface plane 32, (as illustrated as a dotted line in FIG. 2). Microlenses 34 are located in proximity to the output face of the laser diode bars 22 such that the output beam 36 is collimated.

Specific Description

Figure 3:
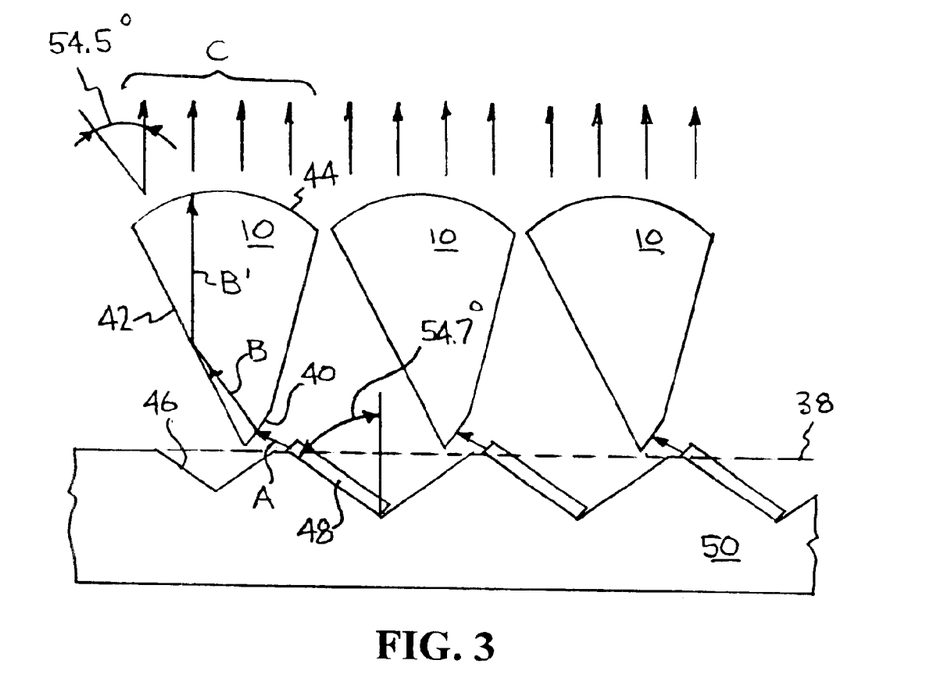
FIG. 3 illustrates a preferred cylindrical lens design for a diode array in which the cylindrical lens includes an internal reflecting surface which deviates the propagation direction of the incident laser diode light in a controlled manner.

The preferred cylindrical lens 10 illustrated in FIG. 3 overcomes previous problems by providing a fast (high numerical aperture), collimating cylindrical microlens that directs optical rays C normal to a silicon <110> substrate surface plane 38 (shown as a dotted line in FIG. 3). A first surface 40, such as a flat or a curved surface, refracts ray B after being received from a divergent ray output emission A from a light source 48. Such a light source 48, could be for example, a laser diode, positioned at an angle between about −49.7 degrees and about −59.7 degrees, with a preferred angle of about −54.7 degrees with respect to a normal of a silicon <110> substrate plane 38, defined by a V-groove mounting 46 on a silicon substrate 50. A second surface 42, preferably a flat surface, comprising an internal and an external side, is designed to receive refracted ray B at the internal side of surface 42 at an angle greater than a critical angle (i.e., an angle wherein ray B' is totally internally reflected). However, the second surface can be formed with curvature to additionally receive ray B at an angle greater than the critical angle, examples of which include hyperbolic, concave, and convex surfaces, etc. The totally internally reflected light ray B', is reflected at an angle with respect to a normal from the second surface between about 45 degrees and about 75 degrees, with a preferred angle of about 62.5 degrees, from the normal to the surface 42 and directed to a third surface 44 opposite its original propagation angular direction as illustrated by ray A. An optical reflective coating (not shown) can be applied by any method to the external side of surface 42, such as for example by electron beam or vacuum sputtered deposition. This coating can increase the reflectivity of surface 42 in the event that the required critical angle at surface 42 by a ray B, cannot be met for emission from a particular light source 48. The third surface 44 comprises a curved surface, such as for example, a convex curvature, and a focal line (not shown) comprising a plurality of ray A at the focal point of the third surface 44 is positioned proximate to first surface 40 to collimate rays C that exit surface 44 with an overall direction that is normal to the silicon <110> substrate surface plane 38.

To enhance transmission throughput of the preferred embodiment, the first and the third surface can further comprise a broadband anti-reflective coating between about 800 nm and about 2 microns with a preferred predetermined narrow band coating applied for specific applications to their input and output surfaces, respectively. The configuration in FIG. 3 has application in not only collimating laser diodes, laser diode bars and two-dimensional laser diode arrays, but it additionally has the added benefit of redirecting the off-normal emission of positioned laser diodes due to V-groove mounting on the <111> plane of silicon substrates.

The design of a conventional cylindrical microlens, (i.e., one without an internally reflective surface), is an initial step in the design of a related cylindrical microlens with an internally reflective surface that is appropriate for use with diode bars mounted in the V-grooves of a SiMM or V-BASIS package.

Figure 4:
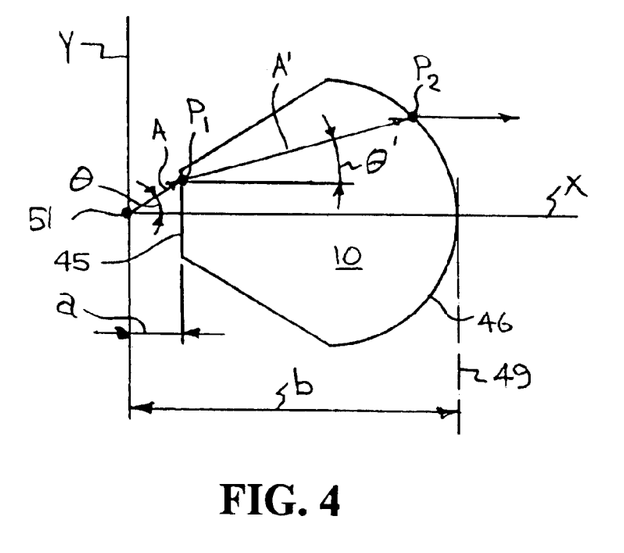
FIG. 4 illustrates a cross sectional view for initial optical design considerations using a plano-convex lens as a starting point.

FIG. 4 illustrates a lens that is of a plano-convex design (i.e., a planar surface 45 and a curved surface 46), with the planar surface oriented as the input side of the lens 10. $P_1$ is an intersection point of ray A at a planar surface 45 and $P_2$ is an intersection point of ray A' at curved surface 46. Angles θ (the launch angle of an arbitrary ray A leaving a diode aperture (not shown) at an origin 51) and θ', the refracted angle of ray A' define the incident and refracted rays at a planar surface 45, with n being the index of refraction of the cylindrical lens 10 material. If the vertical dotted line 49 in FIG. 4 represents a phase front of a collimated wave leaving the curved surface 46, then Fermat's principle, (i.e., the principle that an electromagnetic wave will take a path that involves the least travel time when propagating between two points), requires that the travel time for any ray between the diode aperture (not shown) at the origin 51 and an arbitrary point (not shown) on the planar phase front 49 be a constant.

Therefore, a set of equations are defined that give the points (x,y) in FIG. 4, which comprise the curved output surface 46 of the lens parametrically in terms of θ and θ'. First, an equation (1) that is representative of the constraint imposed by Snell's law, (i.e., a law that defines an incident and refracted ray with respect to a surface normal when traveling from one medium into another), is written describing the relation between the incident and refracted angles rays A and A' in FIG. 4 makes at the planar input face 45 of the lens at point $P_1$, and of which ray A' intersects curved surface 46 at $P_2$. In addition, the diode aperture (not shown) is assumed to be at origin 51, the distance a is from the diode aperture to the lens input face 45 along the optic axis x, and distance b is the on axis thickness in the diode aperture to phase front 49:

$$\frac{y - a\tan(\theta)}{x - a} = \tan(\theta') = \frac{\sin(\theta)}{\sqrt{n^2 - \sin^2(\theta)}} \quad (1)$$

where n is the index of refraction of the lens 46 material, a is the distance from the laser diode output aperture, θ and θ' are the incident and refracted angles at planar surface 45 at $P_1$, and x,y define the coordinate axis.

Second, a travel time along the arbitrary ray path can be equated between the diode aperture located at 51 and a point on the phase front depicted by the dotted vertical line 49 in FIG. 4, to the travel time along the specific ray path that follows the optical axis (i.e., the x-axis coordinate in FIG. 4).

$$a\sqrt{1 + \tan(\theta)^2} + n\sqrt{(x-a)^2 + (y - \tan(\theta))^2} + (b - x) = a + n(b - a) \quad (2)$$

Solving equations (1) and (2) for x and y gives the points on the output curved surface of lens 46 in terms of θ:

$$x = \frac{a\left[1 - n - \sqrt{1 + \tan^2(\theta)} + n\sqrt{1 + \frac{\sin^2(\theta)}{n^2 - \sin^2(\theta)}}\right] + b[n-1]}{n\sqrt{1 + \frac{\sin^2(\theta)}{n^2 - \sin^2(\theta)}} - 1} \quad (3)$$

$$y = a\tan(\theta) + \left(\frac{a\left[1 - n - \sqrt{1 + \tan^2(\theta)} + n\sqrt{1 + \frac{\sin^2(\theta)}{n^2 - \sin^2(\theta)}}\right] + b[n-1]}{n\sqrt{1 + \frac{\sin^2(\theta)}{n^2 - \sin^2(\theta)}} - 1} - a\right)\frac{\sin(\theta)}{\sqrt{n^2 - \sin^2(\theta)}}$$

The expression given in equation (3) leads straightforwardly to the curved output lens surface in FIG. 4, which substantially collimates the light emerging from the laser diode aperture.

Figure 5:
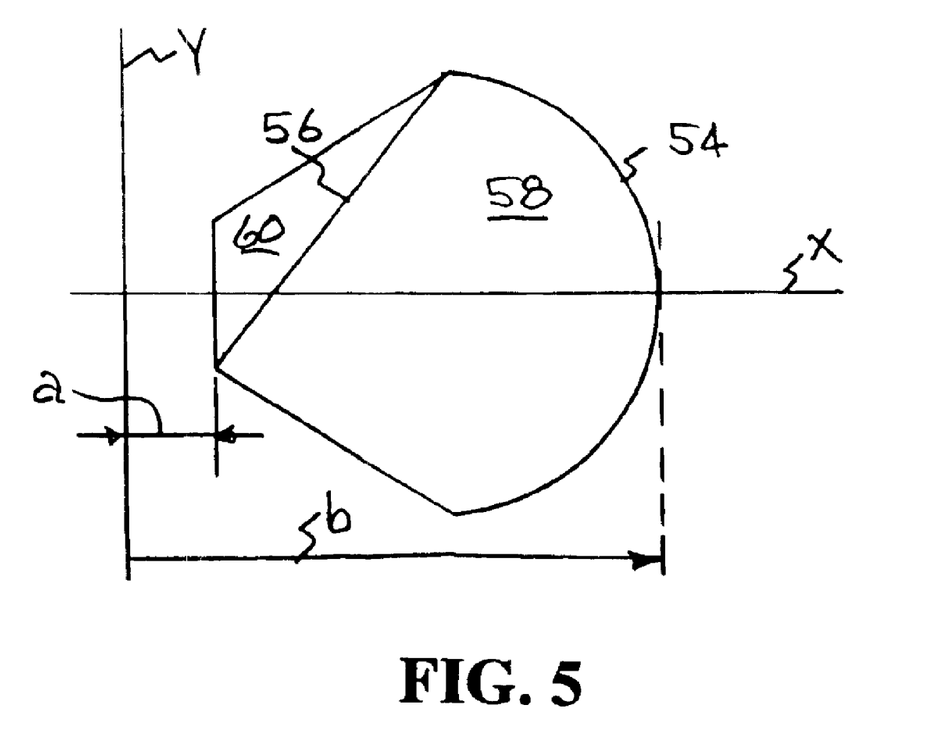
FIG. 5 represents a cross sectional view for an initial optical layout for a lens design with an internally reflecting surface. This design is derived from the previous design by introducing a reflecting surface within the lens. The actual lens profile is then determined by reflecting that portion of the lens after the reflective surface about the reflective surface.

The preferred lens design with an internally reflecting surface can be generated using a method of images construction as described hereinafter in FIG. 5. Region 58 and region 60 in FIG. 5 are sections of a cylindrical lens 54 that are used for demonstrating the method of images construction, i.e., rays passing through a simulated internally reflective surface 56 is shown in region 58 to illustrate how they need to be reflected from region 60. Thus, the internally reflecting surface represented by line 56, preferably a flat surface, in FIG. 5 is used to reflect optical rays from region 58, below surface 56, so as to be above internally reflecting surface 56, i.e., region 60.

Figure 6:
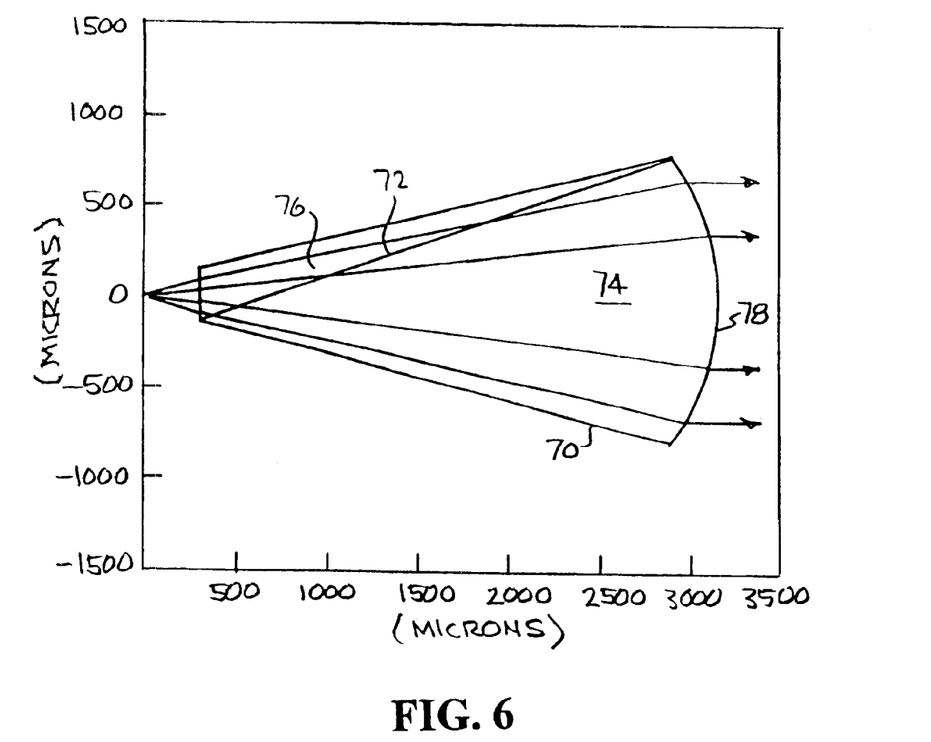
FIG. 6 represents a cross sectional view for an optical layout for a lens design without an internally reflecting surface using the method of images construction.

FIG. 6 represents a cylindrical microlens 70 design for a laser diode array, such as for example a SiMM package, without an internally reflecting surface using the method of images construction as discussed herein before. The components comprise a region 76 above a simulated internally reflective surface 72, a region 74 below the simulated internally reflective surface 72, and a surface 78 to collimate rays from an emission source (not shown). Thus, the reflecting surface 72 in FIG. 6 is used as an initial step in the method of images construction to reflect those rays in region 74, (which would be collimated if allowed to travel to surface 78), which are below surface 72 to region 76 which is the region above reflecting surface 72.

Figure 7:
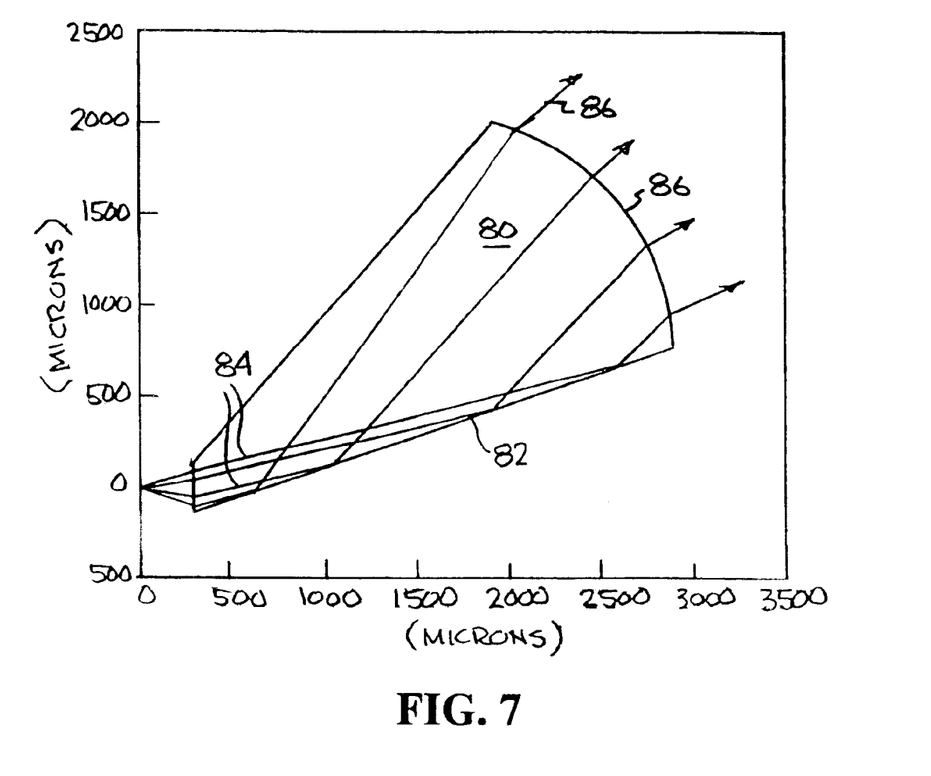
FIG. 7 represents a cross section view for an optical layout for a lens design with an internally reflecting surface, which can be used with a diode or diode array package.

FIG. 7 represents a cylindrical microlens 80 with an internally reflective surface that is related to the initial step in the cylindrical microlens design without a reflective surface as discussed above for FIG. 6. The components as illustrated in FIG. 7, are an internally reflective surface 82, a plurality of rays 84 from an emission source, such as for example a laser diode (not shown), and a surface 86 to collimate rays 84 as illustrated by rays 88. Lens 80 can be utilized in a laser diode or laser diode array package, such as a SiMMs or V-BASIS package, wherein rays 88 exit lens 80 collimated from surface 86 and in a direction normal to the plane of an array such as plane 38 illustrated in FIG. 3.

An important aspect of the present invention in the design of reflective surface 82 in FIG. 7, is that rays 84 can experience total internal reflection at internally reflecting surface 82. Thus, no optical coating is required in this case, and all rays will be reflected with unity efficiency, i.e., all rays 84 intersecting reflecting surface 82 are at an incident angle beyond the critical angle ($\theta_{inc} > \sin^{-1}(1/n)$), where n is the index of the lens material. However, as briefly discussed above for the preferred lens in FIG. 3, an optical reflective coating can be applied to an external side of surface 82, if surface 82 is not a totally internally reflecting surface.

Another important aspect of the present invention encompasses microlens conditioning applied to large two-dimensional semiconductor laser diode arrays consisting of multiple laser diode bars, the effective radiance, (W/cm²-steradian), wherein a steradian is a solid angle subtended from an emission source, of the array can be increased up to 100 times because an internally reflecting surface 82 of lens 80 can be designed to essentially fill all the available space between the light source 48 illustrated in FIG. 3.

Changes and modifications in the specifically described embodiments can be carried out without departing from the scope of the invention, which is intended to be limited by the scope of the appended claims.

What is claimed:

1. A method of forming a micro-lens having an internal reflecting surface, comprising:
   forming a preform having the shape of a cylindrical lens wherein said lens further comprises: 1) an input refracting surface, 2) at least one internally reflecting surface adapted to substantially totally internally reflect refracted radiation from said input refracting surface with unity efficiency, and 3) an output refracting surface; and
   drawing said preform to form a cylindrical lens having a cross-sectional shape of said preform, wherein said cross-sectional shape dimensions are reduced below the cross-sectional shape dimensions of said preform.

2. The method of claim 1, wherein said lens is fabricated using a shaped fiber pulling technology.

3. The method of claim 1, wherein said perform is ground using conventional optical grinding technology to produce a predetermined shape of said lens.

4. The method of claim 1, wherein said input refracting surface is flat and adapted to be at an incident angle in relation to a predetermined light source and wherein emission from said light source is substantially refracted.

5. The method of claim 1, wherein said input refracting surface is curved and adapted to be at an incident angle in relation to a predetermined light source and wherein said emission from said light source is substantially refracted.

6. The method of claim 1, wherein said internally reflecting surface is flat.

7. The method of claim 1, wherein said internally reflecting surface is curved.

8. The method of claim 1, wherein said output refracting surface is curved.

9. The method of claim 1, wherein said output refracting surface is adapted to optically condition a divergence angle from a fast axis from a predetermined light source so that emission from said light source directed by said output refracting surface comprise optical rays which are substantially parallel along said fast axis.

10. The method of claim 1, wherein said output refracting surface is formed to comprise the shape of a convex curvature.

11. A method of forming a micro-lens having an internal reflecting surface, comprising:
   forming a preform having a shape of a cylindrical lens, wherein said lens further comprises: 1) a first surface adapted for refracting an emission from a predetermined light source oriented at a first angle, 2) at least one second surface adapted to receive said refracting emission from said first surface, wherein said second surface further comprises an internal surface adapted to substantially totally internally reflect said refracted emission from said first surface with unity efficiency and wherein a designed angle for substantially all of said refracted emission received by said second surface is greater than a critical angle necessary for total internal reflection, and 3) a third surface adapted to receive and direct said totally internally reflected emission external to said third surface, wherein said directed emission by said third surface further comprise optical rays which are substantially parallel and are deviated at a second angle with respect to an initial propagation direction from said light source; and drawing said preform to form a cylindrical lens having a cross-sectional shape of said preform, wherein said cross-sectional shape dimensions are reduced below the cross-sectional shape dimensions of said preform.

12. The method of claim 11, wherein said lens is fabricated using a shaped fiber pulling technology.

13. The method of claim 11, wherein said perform is ground using conventional optical grinding technology to produce a predetermined shape of said lens.

14. The method of claim 11, wherein said first surface is flat and adapted to be at an incident angle in relation to a predetermined light source and wherein emission from said light source is substantially refracted.

15. The method of claim 11, wherein said first surface is curved and adapted to be at an incident angle in relation to a predetermined light source and wherein said emission from said light source is substantially refracted.

16. The method of claim 11, wherein said at least one second surface is flat.

17. The method of claim 11, wherein said at least one second surface is curved.

18. The method of claim 11, wherein said third surface is curved.

19. The method of claim 11, wherein said third surface is adapted to optically condition a divergence angle from a fast axis from a predetermined light source so that emission from said light source directed by said third surface comprise optical rays which are substantially parallel along said fast axis.

20. The method of claim 11, wherein said third surface is formed to comprise the shape of a convex curvature.

* * * * *